US012607684B2

(12) United States Patent
Jang et al.

(10) Patent No.: US 12,607,684 B2
(45) Date of Patent: Apr. 21, 2026

(54) APPARATUS FOR MANAGING BATTERY AND METHOD THEREOF

(71) Applicants: Hyundai Motor Company, Seoul (KR); Kia Corporation, Seoul (KR)

(72) Inventors: Hyun Jun Jang, Daegu (KR); Tae Kyu Kang, Suwon-Si (KR); Dae Hyun Jung, Jeonju-Si (KR); Woo Sung Kim, Suwon-Si (KR); Byung Soo Park, Daejeon (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 203 days.

(21) Appl. No.: 18/517,752

(22) Filed: Nov. 22, 2023

(65) Prior Publication Data

US 2024/0345170 A1      Oct. 17, 2024

(30) Foreign Application Priority Data

Jul. 14, 2023      (KR) ........................ 10-2023-0091973

(51) Int. Cl.
| | |
|---|---|
| *G01R 31/387* | (2019.01) |
| *B60L 58/12* | (2019.01) |
| *B60L 58/16* | (2019.01) |
| *G01R 31/392* | (2019.01) |
| *H01M 10/48* | (2006.01) |

(52) U.S. Cl.
CPC ............ *G01R 31/387* (2019.01); *B60L 58/12* (2019.02); *B60L 58/16* (2019.02); *G01R 31/392* (2019.01); *H01M 10/48* (2013.01)

(58) Field of Classification Search
None
See application file for complete search history.

(56) References Cited

U.S. PATENT DOCUMENTS

| | | | | |
|---|---|---|---|---|
| 5,798,702 A | * | 8/1998 | Okamoto ................. | B62M 6/45 |
| | | | | 340/432 |
| 2021/0061119 A1 | * | 3/2021 | Akaishi ..................... | H02J 1/10 |
| 2022/0317194 A1 | | 10/2022 | Lee et al. | |
| 2023/0234451 A1 | * | 7/2023 | Zhao ................... | B60L 15/2045 |
| | | | | 320/137 |

FOREIGN PATENT DOCUMENTS

KR      10-2021-0087294 A      7/2021

* cited by examiner

*Primary Examiner* — Jas A Sanghera
(74) *Attorney, Agent, or Firm* — MORGAN, LEWIS & BOCKIUS LLP

(57) ABSTRACT

An apparatus for managing a battery and a method thereof includes a memory that stores computer-executable instructions, and at least one processor that accesses the memory and execute the instructions, wherein the at least one processor is configured to determine a first score based on battery usage data and a battery output map, determine a second score based on first user data on a mileage of a vehicle using the battery and a warranty time of the vehicle, and second user data on a state of health (SOH) of the battery and the warranty time, and derive a battery managing index (BMI) representing a management state of the battery based on the first score and the second score.

18 Claims, 10 Drawing Sheets

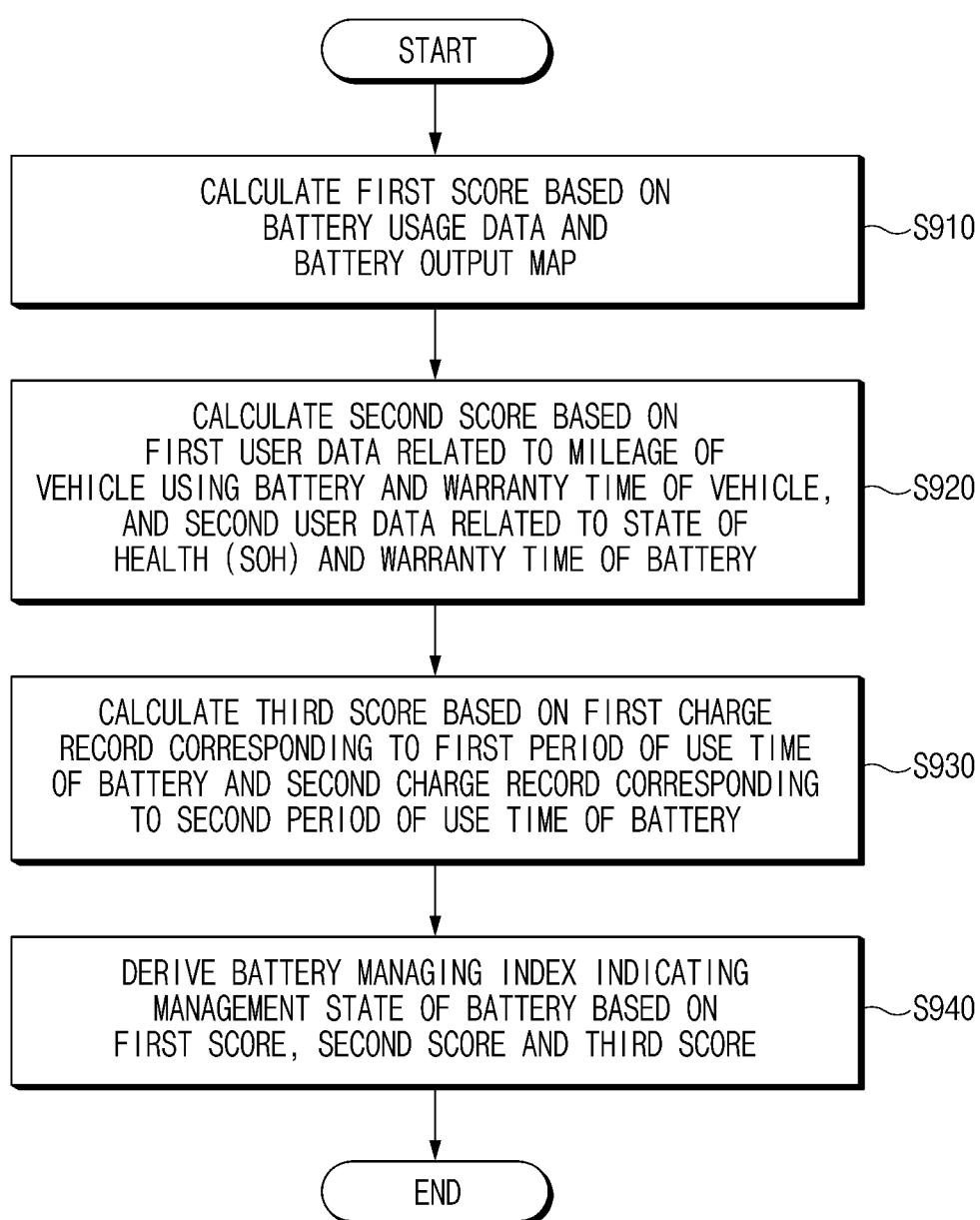

START

CALCULATE FIRST SCORE BASED ON
BATTERY USAGE DATA AND
BATTERY OUTPUT MAP     ~S910

CALCULATE SECOND SCORE BASED ON
FIRST USER DATA RELATED TO MILEAGE OF
VEHICLE USING BATTERY AND WARRANTY TIME OF VEHICLE,
AND SECOND USER DATA RELATED TO STATE OF
HEALTH (SOH) AND WARRANTY TIME OF BATTERY     ~S920

CALCULATE THIRD SCORE BASED ON FIRST CHARGE
RECORD CORRESPONDING TO FIRST PERIOD OF USE TIME
OF BATTERY AND SECOND CHARGE RECORD CORRESPONDING
TO SECOND PERIOD OF USE TIME OF BATTERY     ~S930

DERIVE BATTERY MANAGING INDEX INDICATING
MANAGEMENT STATE OF BATTERY BASED ON
FIRST SCORE, SECOND SCORE AND THIRD SCORE     ~S940

END

APPARATUS FOR MANAGING BATTERY AND METHOD THEREOF

CROSS-REFERENCE TO RELATED APPLICATION

The present application claims priority to Korean Patent Application No. 10-2023-0091973, filed on Jul. 14, 2023, the entire contents of which is incorporated herein for all purposes by this reference.

BACKGROUND OF THE PRESENT DISCLOSURE

Field of the Present Disclosure

The present disclosure relates to an apparatus for managing a battery and a method thereof, and more particularly, to a technology for providing information on a battery management state to a vehicle user by determining battery usage intensity based on driving data.

Description of Related Art

While the environment and energy resources are considered important, electric vehicles for the present purpose are in the limelight as an eco-friendly transportation means of the future. In the instant case, an electric vehicle utilizes a relatively expensive battery as a power source compared to other components.

Therefore, to efficiently use the battery of an electric vehicle, many researches and technological developments have recently been conducted. A technology for providing feedback to a user of an electric vehicle based on a state of health (SOH) of a battery is applied to mass-produced electric vehicles.

On the other hand, there is no technology for immediately providing feedback in real time to a user of an electric vehicle based on battery usage data. Accordingly, it is necessary to develop a technology for providing feedback to the user in real time on the intensity of battery usage based on driving data.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an apparatus for managing a battery, which is configured for deriving a battery managing index (BMI) indicating a management state of a battery based on a first score related to a battery output map, a second score related to a vehicle mileage, and a third score related to a battery charge record, and a method thereof.

Another aspect of the present disclosure provides an apparatus for managing a battery, which is configured for determining charge output data and discharge output data based on battery usage data and a battery output map, and a method thereof.

Yet another aspect of the present disclosure provides an apparatus for managing a battery, which is configured for determining an average value of charge output and a maximum value of charge output based on measurement conditions for the temperature and state of charge of the battery, and a method thereof.

Yet another aspect of the present disclosure provides an apparatus for managing a battery, which is configured for determining data on a battery charge record based on the number of standard charges and the number of quick charges of the battery for each use period of the battery, and a method thereof.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an apparatus for managing a battery includes a memory that stores computer-executable instructions, and at least one processor that accesses the memory and executes the instructions, wherein the at least one processor is configured to determine a first score based on battery usage data and a battery output map, determine a second score based on first user data on a mileage of a vehicle using the battery and a warranty time of the vehicle, and second user data on a state of health (SOH) of the battery and the warranty time, and determine a battery managing index (BMI) representing a management state of the battery based on the first score and the second score.

According to an exemplary embodiment of the present disclosure, the at least one processor is configured to determine a third score based on a first charge record corresponding to a first period of a use time of the battery and a second charge record corresponding to a second period of the use time of the battery, and derive the BMI based on the first score, the second score and the third score.

According to an exemplary embodiment of the present disclosure, the at least one processor is configured to determine charge output data based on charging data of the battery usage data and maximum charging data of the battery output map, determine discharge output data based on discharge data of the battery usage data and maximum discharge data of the battery output map, and determine the first score based on the charge output data and the discharge output data.

According to an exemplary embodiment of the present disclosure, the at least one processor is configured to determine an average charge output of the charging data based on a temperature of the battery and a measurement condition related to a state of charge (SOC) value of the battery, determine a maximum charge output of the maximum charging data based on the measurement condition, and determine the charge output data based on a ratio of the average charge output and the maximum charge output.

According to an exemplary embodiment of the present disclosure, the at least one processor is configured to determine an average discharge output of the discharge data based on a temperature of the battery and a measurement condition related to a state of charge (SOC) value of the battery, determine a maximum discharge output of the maximum discharge data based on the measurement condition, and determine the discharge output data based on a ratio of the average discharge output and the maximum discharge output.

According to an exemplary embodiment of the present disclosure, the at least one processor is configured to determine the second score based on applying a first weight value related to the mileage of the vehicle to the first user data and applying a second weight value related to the SOH of the battery to the second user data.

According to an exemplary embodiment of the present disclosure, the at least one processor is configured to determine the first charge record based on a ratio of a number of standard charges of the battery during the first period and a number of charges of the battery during the first period, determine the second charge record based on a ratio of a number of standard charges of the battery during the second period and a number of charges of the battery during the second period, and determine the third score based on the first charge record and the second charge record, wherein the number of charges of the battery in the first period and the second period includes the number of standard charges of the battery and a number of quick charges of the battery in the first period and the second period.

According to an exemplary embodiment of the present disclosure, the at least one processor is configured to determine the third score based on the first charge record and the second charge record to which a third weight for reflection of the second period is applied.

According to an exemplary embodiment of the present disclosure, the at least one processor is configured to determine a representative score by summing the first score, the second score and the third score, and compare the representative score with a first threshold score and determine the battery managing index as at least one of a good index, a normal index, and an insufficient index based on the comparison between the representative score and a second threshold score.

According to an exemplary embodiment of the present disclosure, the at least one processor may provide the battery managing index to a user using the vehicle, and provide a battery usage guide or a vehicle driving guide according to the battery managing index to the user.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 9 is a flowchart illustrating a method of managing a battery according to an exemplary embodiment of the present disclosure.

With regard to description of drawings, the same or similar elements may be marked by the same or similar reference numerals.

Figure 1:
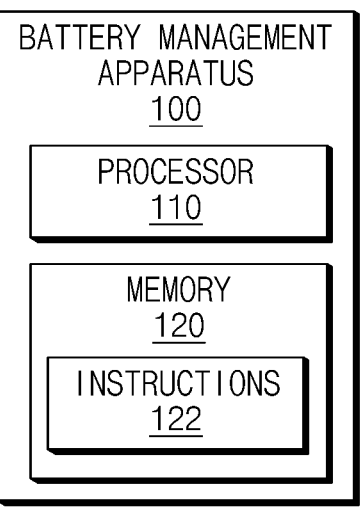
FIG. 1 is a block diagram illustrating an apparatus for managing a battery according to an exemplary embodiment of the present disclosure.

It may be understood that the appended drawings are not necessarily to scale, presenting a somewhat simplified representation of various features illustrative of the basic principles of the present disclosure. The predetermined design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the exemplary drawings. In adding the reference numerals to the components of each drawing, it should be noted that the identical or equivalent component is designated by the identical numeral even when they are displayed on other drawings. Furthermore, in describing the exemplary embodiment of the present disclosure, a detailed description of the related known configuration or function will be omitted when it is determined that it interferes with the understanding of the exemplary embodiment of the present disclosure. Various embodiments of the present disclosure may be described with reference to accompanying drawings. Accordingly, those of ordinary skill in the art will recognize that modification, equivalent, and/or alternative on the various embodiments described herein may be variously made without departing from the scope and spirit of the present disclosure. With regard to description of drawings, similar elements may be marked by similar reference numerals.

Terms, such as first, second, A, B, (a), (b) or the like may be used herein when describing components of the present disclosure. The terms are provided only to distinguish the elements from other elements, and the essences, sequences, orders, and numbers of the elements are not limited by the terms. Furthermore, unless defined otherwise, all terms used herein, including technical or scientific terms, include the same meanings as those generally understood by those skilled in the art to which the present disclosure pertains. The terms defined in the generally used dictionaries should be construed as including the meanings that coincide with the meanings of the contexts of the related technologies, and should not be construed as ideal or excessively formal meanings unless clearly defined in the specification of the present disclosure. For example, the terms, such as "first", "second", and the like used herein may refer to various elements of various embodiments of the present disclosure, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

In an exemplary embodiment of the present disclosure disclosed herein, the expressions "have", "may have", "include" and "comprise", or "includes" and "may comprise" used herein indicate existence of corresponding features (e.g., elements such as numeric values, functions, operations, or components) but do not exclude presence of additional features.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used herein may be used as, for example, the expression "suitable for", "having the capacity to", "designed to", "adapted to", "made to", or "capable of". The term "configured to" may not mean only "designed to" in hardware. Instead, the expression "a device configured to" may mean that the device is "capable of" operating together with another device or other components. CPU, for example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device. Terms used in the present disclosure are used to describe specified embodiments of the present disclosure and are not intended to limit the scope of the present disclosure. The terms of a singular form may include plural forms unless otherwise specified. All the terms used herein, which include technical or scientific terms, may include the same meaning which is generally understood by a person skilled in the art. It will be further understood that terms, which are defined in a dictionary and commonly used, should also be interpreted as is customary in the relevant related art and not in an idealized or overly formal sense unless so defined herein In various embodiments of the present disclosure. In some cases, even if terms are terms which are defined in an exemplary embodiment of the present disclosure, they may not be interpreted to exclude embodiments of the present disclosure.

In an exemplary embodiment of the present disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included. Furthermore, as used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. A phrase such as "at least one of A, B, C, or any combination thereof" may include A or B or C or a combination thereof such as AB or ABC.

Hereinafter, various exemplary embodiments of the present disclosure will be described in detail with reference to FIGS. 1 to 10.

FIG. 1 is a block diagram illustrating an apparatus for managing a battery according to an exemplary embodiment of the present disclosure.

An apparatus 100 for managing a battery according to various exemplary embodiments of the present disclosure may include a processor 110 and a memory 120 for storing instructions 122.

The apparatus 100 for managing a battery may refer to an apparatus that provides a battery managing index (BMI) indicating a management state of a battery to a vehicle user. For example, the apparatus 100 may be configured to determine the battery management state as at least one of a good management index, a normal management index, and an insufficient management index. The apparatus 100 may provide the determined battery management state to the user through an output device including a vehicle cluster or audio, video, and navigation (AVN).

The apparatus 100 may derive the battery managing index based on a first score related to a battery output map, a second score related to a vehicle mileage, and a third score related to a battery charge record. For example, the first score may be determined based on a battery output map and battery usage data. The second score may be determined based on the vehicle mileage, a warranty time of the vehicle, and state-of-health (SOH) data of the battery. Next, the third score may be determined based on charge records accumulated from the time the vehicle is shipped and charge records accumulated during a unit period of one month.

The apparatus 100 may be configured to determine a representative score by summing the first score, the second score and the third score (hereinafter, referred to as the first, second, and third scores). The apparatus 100 may compare the determined representative score with a first threshold score and determine the battery managing index based on the comparison between the representative score and a second threshold score. However, the method of determining the representative score is not limited thereto. For example, the representative score may be determined by applying weights to the first, second, and third scores, respectively, and summing them. For reference, the method of determining the battery managing index will be described in detail with reference to FIG. 7 below. Furthermore, the method of determining the representative score is not limited to thereto. For example, the representative score may be determined by summing the first score and the second score. Therefore, in an exemplary embodiment of the present disclosure, for convenience of description, it is mainly described that the representative score is determined by summing the first, second, and third scores.

The apparatus 100 may provide the determined battery managing index to a vehicle user. In more detail, the apparatus 100 may provide the battery managing index to the vehicle user, and at the same time, a battery usage guide or a vehicle driving guide according to the battery managing index to the vehicle user. The method of providing a battery managing index to a vehicle user will be described in detail with reference to FIG. 8 below.

The processor 110 may execute software and may be configured for controlling at least one other component (e.g., a hardware or software component) connected to the processor 110. The processor 110 may access the memory 120 to execute the instructions 122. The processor 110 may also perform various data processing or determinations. For example, the processor 110 may store, in the memory 120, the first, second, and third scores for deriving the battery managing index, and a plurality of data (e.g., a battery output map, a vehicle mileage, a battery charge record, or the like) for determining the first, second, and third scores. The processor 110 may provide the battery managing index to a vehicle user through a method of managing a battery described below with reference to FIGS. 2 to 9.

For reference, the processor 110 may perform all operations performed by the apparatus 100 for managing a battery. Therefore, in an exemplary embodiment of the present disclosure, for convenience of description, the operation performed by the apparatus 100 for managing a battery is mainly described as the operation performed by the processor 110.

Furthermore, in an exemplary embodiment of the present disclosure, for convenience of description, the processor 110 is mainly described as being a single processor, but the exemplary embodiment of the present disclosure is not limited thereto. For example, the apparatus 100 may include one or more processors. Each of the one or more processors may perform all operations related to an operation of deriving the battery managing index and an operation of providing the derived battery managing index to a vehicle user.

The memory 120 may temporarily and/or permanently store various data and/or information required to determine the battery managing index. For example, the memory 120 may store at least one of the first, second, and third scores, or a combination thereof.

Figure 2:
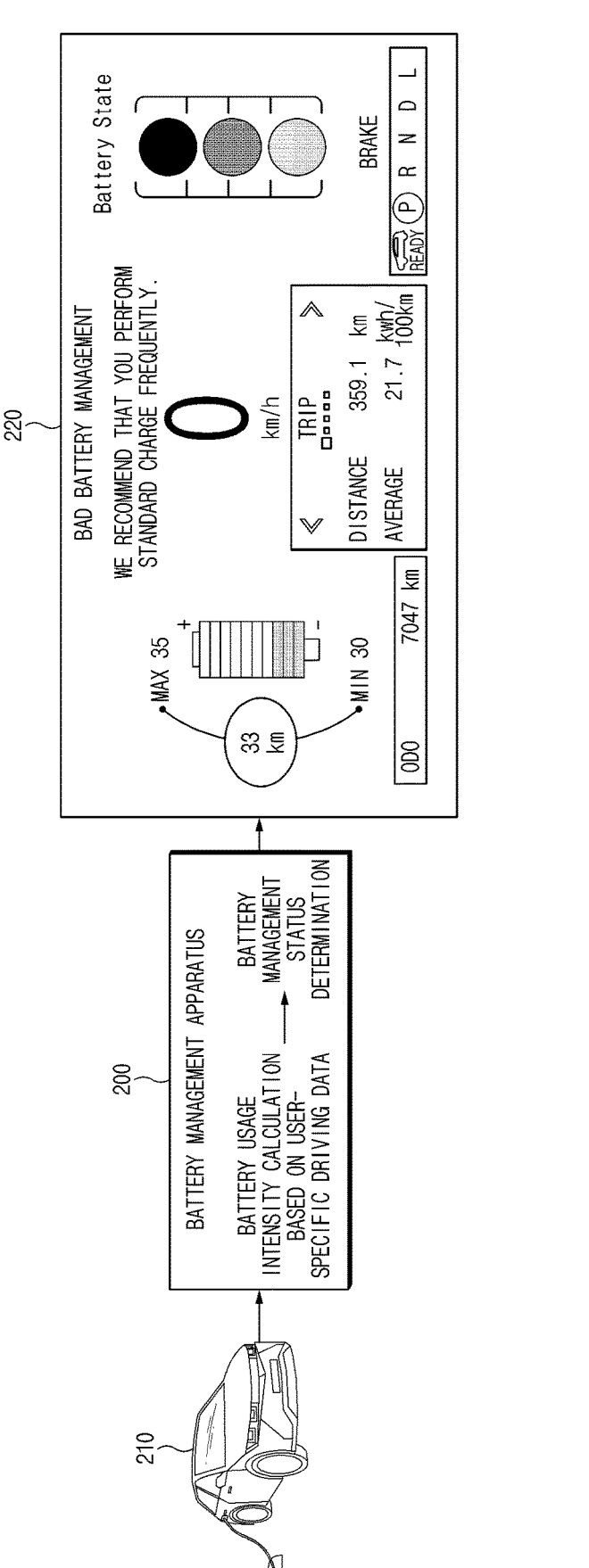
FIG. 2 is a diagram illustrating a method of providing a battery management state to a user by an apparatus for managing a battery according to an exemplary embodiment of the present disclosure.

FIG. 2 is a diagram illustrating a method of providing a battery management state to a user by an apparatus for managing a battery according to an exemplary embodiment of the present disclosure.

An apparatus 200 according to various exemplary embodiments of the present disclosure may provide a battery management state to a user based on driving data for each user. For example, the apparatus 200 may obtain driving data for each user from a vehicle 210. The apparatus 200 may be configured to determine (or operate) the battery usage intensity based on at least one of a battery output map, a vehicle mileage, or a battery charge record, or a combination thereof.

The driving data may include a battery output map, a vehicle mileage, and a battery charge record. Furthermore, the driving data may include data on vehicle driving and data on a battery. For example, the data on vehicle driving may include a mileage of the vehicle and a warranty period of the vehicle. The data on a battery may include an SOH of the battery, a battery usage period, charge data, discharge data, a battery output map, a battery temperature, a battery charge state, a number of standard charges of the battery, and a number of quick charges of the battery.

The battery usage intensity may represent information related to a state of a battery when a vehicle user utilizes a battery of the vehicle. For example, when a vehicle user utilizes a vehicle battery in a harsh environment or severely, the battery usage intensity may be low. To the contrary, when the vehicle user utilizes the battery of the vehicle in an intact environment or completely, the battery usage intensity may be a high score. As will be described later, the battery usage intensity may be at least one of the first, second, and third scores, or a representative score obtained by adding the first, second, and third scores, or a combination thereof.

The apparatus 200 may derive the battery management state through the battery usage intensity determined based on driving data for each user obtained from the vehicle 210. For example, the apparatus 200 may be configured to determine the battery management state as a good index when the battery usage intensity (e.g., representative score) indicates a high score. As will be described later, the battery management state may be a battery managing index determined through a representative score obtained by summing the first, second, and third scores.

The apparatus 200 may provide the derived battery management state to a vehicle user through an output device including a cluster 220 of the vehicle. For example, when the battery management state is an insufficient index, the apparatus 200 may provide insufficient battery management state information to the user as a battery state (e.g., a battery state included in the cluster 220). Furthermore, when the battery management state is an insufficient index, the apparatus 200 may provide information recommending slow charging to the vehicle user.

Figure 3:
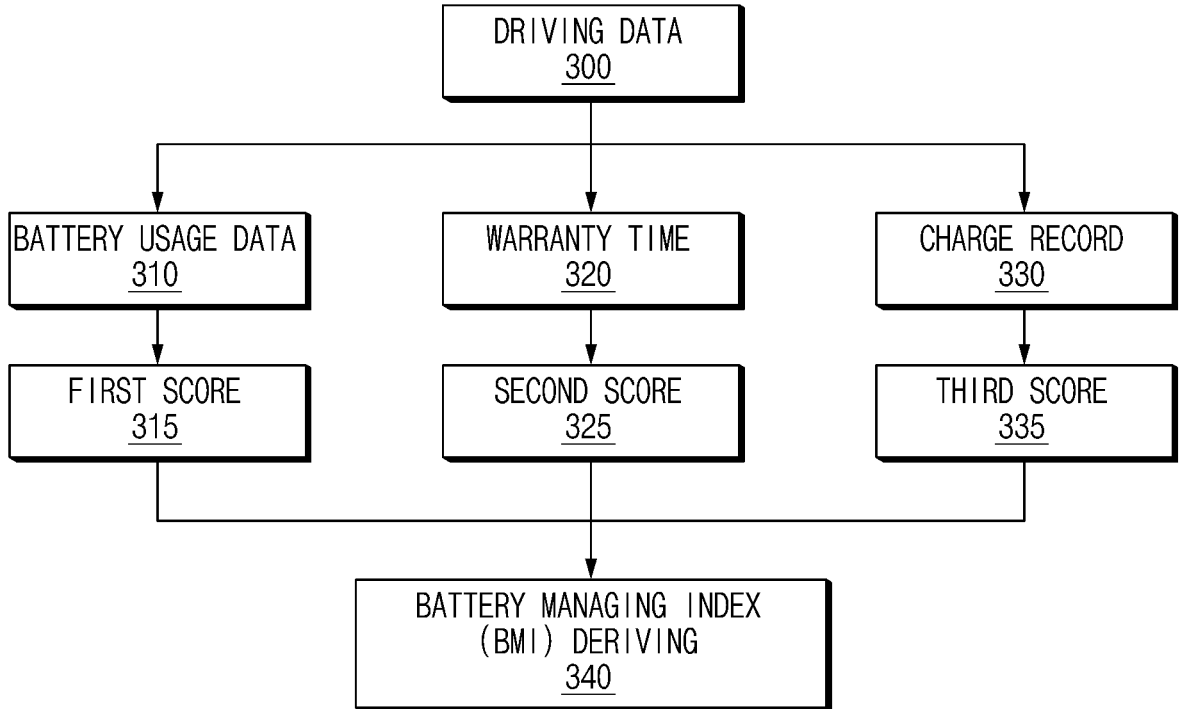
FIG. 3 is a diagram illustrating a method of determining a battery managing index determined based on the first score, the second score and the third score by an apparatus for managing a battery according to an exemplary embodiment of the present disclosure.

FIG. 3 is a diagram illustrating a method of determining a battery managing index determined based on a first score 315, a second score 325, and a third score 335 by the apparatus for managing a battery according to an exemplary embodiment of the present disclosure.

An apparatus according to an exemplary embodiment (e.g., the apparatus 100 of FIG. 1) may derive a battery managing index 340 from driving data 300. For example, the driving data 300 may include a vehicle mileage, a vehicle warranty time, an SOH of a battery, a battery usage period, charge data, discharge data, a battery output map, a battery temperature, a battery charge state, the number of standard charges of a battery, and the number of quick charges of a battery. For reference, in an exemplary embodiment of the present disclosure, for convenience of description, an operation using a battery may represent an operation of charging a battery and an operation of discharging a battery, respectively. For example, the battery usage period included in the driving data 300 may include a battery charge period and a battery discharge period.

The apparatus may obtain battery usage data 310, a warranty time 320, and a charge record 330 from the driving data 300 of the vehicle. The apparatus may be configured to determine the first score 315 based on the obtained battery usage data 310. The battery usage data 310 may include a charge output (e.g., 150 KW) during charging of the battery and the discharge output (e.g., 110 KW) during discharging of the battery in a charge state (e.g., SOC 50% to 60%) including a specified temperature (e.g., 30° C.) and a specified percentage interval.

The apparatus may be configured to determine the second score 325 based on the obtained warranty time 320. The warranty time 320 may represent a time from when the vehicle provided with a battery is shipped to when the second score 325 is determined. For example, when the period from the time the vehicle provided with a battery is shipped to the time the second score 325 is determined is 3 years, the warranty time 320 may be three years. For reference, in an exemplary embodiment of the present disclosure, the warranty time 320 may indicate a time different from a time available for free repair from the manufacturer at the time the vehicle is shipped. For example, when the time available for free repair from the manufacturer at the time the vehicle is shipped is 10 years, and the time from the time the vehicle with a battery is shipped to the time the second score 325 is determined is 3 years, the warranty time 320 may be three years.

The apparatus may be configured to determine the third score 335 based on the obtained charge record 330. The charge record 330 may indicate a record of the number of times the battery is charged. For example, the charge record 330 may indicate a ratio of the number of slow charging to the number of slow charging and fast charging. However, the charge record 330 is not limited thereto. For example, the charge record 330 may indicate a ratio of the number of fast charging to the number of slow charging and fast charging.

The battery managing index may indicate indexes for managing lifespan of a battery, performance management of a battery, and safety of a battery. Although described later, the battery managing index may include an index determined through a representative score obtained by summing the first score 315 to the third score 335.

Figure 4:
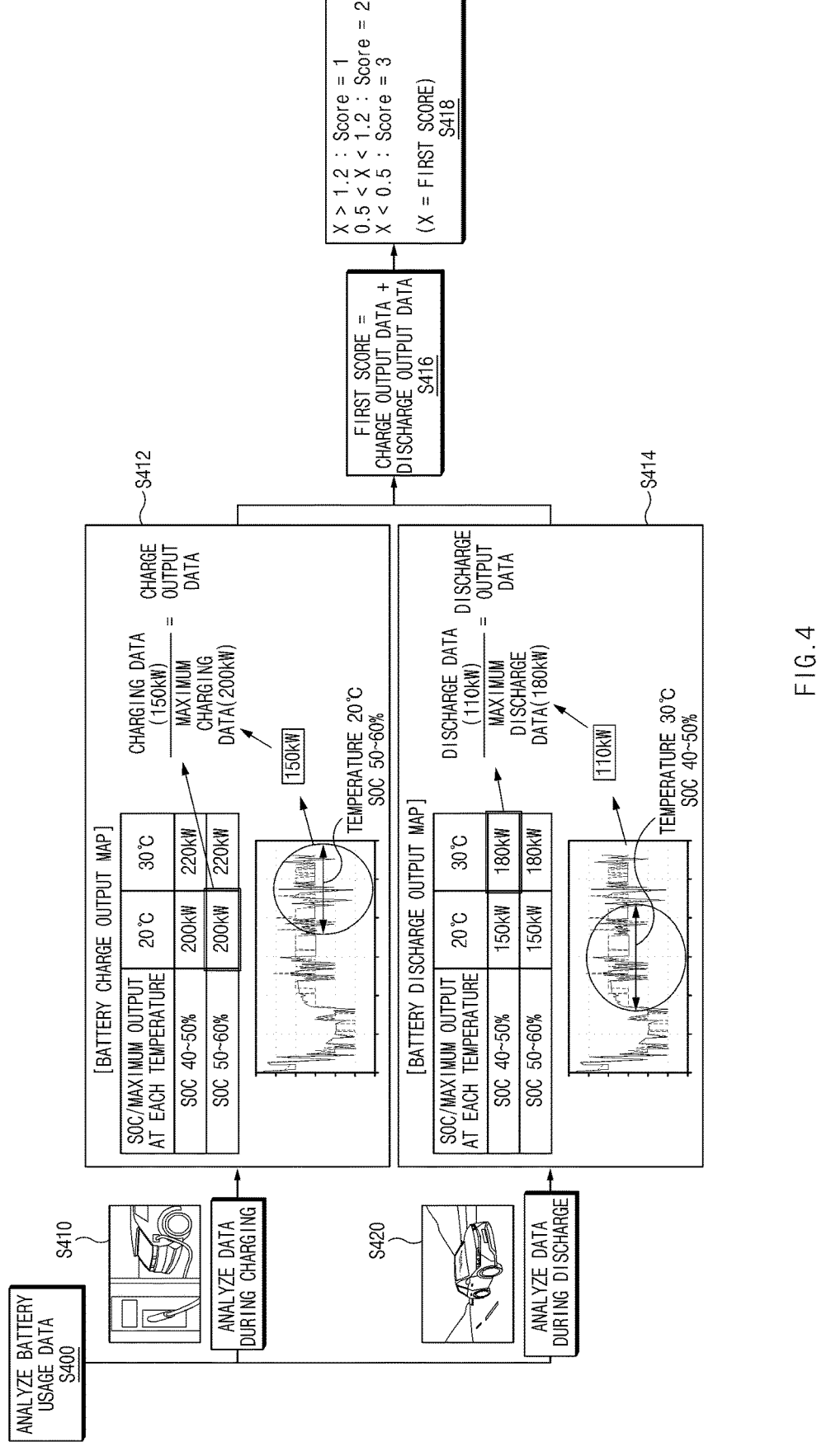
FIG. 4 is a diagram illustrating a method of determining the first score by an apparatus for managing a battery according to an exemplary embodiment of the present disclosure.

FIG. 4 is a diagram illustrating a method of determining a first score by an apparatus for managing a battery according to an exemplary embodiment of the present disclosure.

An apparatus (e.g., the apparatus 100 of FIG. 1) according to various exemplary embodiments of the present disclosure may be configured to determine a first score based on battery usage data and a battery output map.

In operation S400, the apparatus may analyze battery usage data. For example, the battery usage data may include battery charging data and battery discharge data. The charging data of the battery may include a charging output according to a charging time when the battery of the vehicle is in a charged state. Furthermore, the battery discharge data may include a discharge output according to a discharge time when the battery of the vehicle is in a discharge state.

In operation S410, the apparatus may obtain battery charging data indicating charging data from the battery usage data.

In operation S412, the apparatus may be configured to determine charging output data based on charging data among battery usage data and maximum charging data among battery output maps. For example, the charging data may be a charging output according to a charging time when the battery of the vehicle is in a charged state. When the battery of the maximum charging data vehicle is in a charged state, the maximum charge output may be obtained.

The apparatus may be configured to determine an average charging output of charging data (e.g., charging data among battery usage data) based on a temperature of the battery and a measurement condition related to a state of charge (SOC) value of the battery (hereinafter, a measurement condition). For example, the average charge output may indicate an average of charge outputs measured in a section in which the temperature of the battery is maintained at 20 degrees and the SOC value of the battery is maintained at 50 to 60%. For reference, in FIG. 4, for convenience of description, it is mainly described that the average of the charging outputs measured in the section where the temperature of the battery is maintained at 20 degrees and the state of charge of the battery is maintained at 50 to 60% is 150 KW. The average charge output is not limited thereto, and may be changed according to measurement conditions related to the temperature and state of charge of the battery.

The apparatus may be configured to determine the maximum charge output of the maximum charge data based on the above-described measurement condition. For example, the maximum charge output may be obtained based on the measurement conditions (e.g., the battery temperature is maintained at 20 degrees and the battery charge state is maintained at 50 to 60%) and the battery charge output map. For reference, in FIG. 4, for convenience of description, it is mainly described that the maximum charge output based on the battery output map is 200 kW in a section in which the temperature of the battery is maintained at 20 degrees and the SOC value of the battery is maintained at 50 to 60%. the maximum charge output is not limited thereto, and may be changed according to a measurement condition related to the temperature and SOC value of the battery.

The apparatus may be configured to determine the charge output data of the battery based on the ratio of the average charge output and the maximum charge output. For example, when the average charge output is 150 KW and the maximum charge output is 200 kW, the charge output data may be 0.75, which is a value obtained by dividing the average charge output by the maximum charge output.

In operation S420, the apparatus may obtain the battery discharge data indicating data during discharging from the battery usage data.

In operation S414, the apparatus may be configured to determine the discharge output data based on the discharge data of the battery usage data and the maximum discharge data of the battery output map. For example, the discharge data may be a discharge output according to a discharge time when the battery of the vehicle is in a discharging state. When the battery of the maximum discharge data vehicle is being discharged, it may be the maximum discharge output.

The apparatus may be configured to determine an average discharge output of the discharge data (e.g., discharge data of battery usage data) based on the temperature of the battery and the measurement condition (hereinafter, referred to as a measurement condition) related to the discharging state of the battery. For example, the average discharge output may represent an average of discharge outputs measured in a section where the temperature of the battery is maintained at 30 degrees and the discharging state of the battery is maintained at 40 to 50%. For reference, in FIG. 4, for convenience of description, it is mainly described that the average of the discharge outputs measured in the section where the temperature of the battery is maintained at 30 degrees and the discharging state of the battery is maintained at 40 to 50% is 110 KW. The average discharge output is not limited thereto, and may be changed according to a measurement condition related to the temperature of the battery and the discharging state.

The apparatus may be configured to determine the maximum discharge output of the maximum discharge data based on the above-described measurement condition. For example, the maximum discharge output may represent the obtained discharge output based on the measurement condition (e.g., the battery temperature is maintained at 30 degrees and the battery discharge state is maintained at 40 to 50%) and the battery discharge output map. For reference, in FIG. 4, for convenience of description, it is mainly described that the maximum discharge output, which is based on the battery output map measured in the section where the temperature of the battery is maintained at 30 degrees and the discharging state of the battery is maintained at 40 to 50%, is 180 kW. The maximum discharge output is not limited thereto and may be changed according to a measurement condition related to the temperature and discharge state of the battery.

The apparatus may be configured to determine the discharge output data of the battery based on the ratio of the average discharge output and the maximum discharge output. For example, when the average discharge output is 110 KW and the maximum discharge output is 180 kW, the discharge output data may be 0.61, which is a value obtained by dividing the average discharge output by the maximum discharge output.

In operation S416, the apparatus may be configured to determine the first score based on the charge output data and the discharge output data. For example, the apparatus may be configured to determine the first score by summing the charge output data and the discharge output data. However, the method for determining the first score is not limited thereto. For example, the apparatus may be configured to determine the first score by applying a weight to each of the charge output data and the discharge output data and summing the results.

In operation S418, the apparatus may perform normalization on the first score. For example, the apparatus may perform normalization on the first score based on whether the first score, which is a real number, is included in a specified range (e.g., a range of less than 1.2). For reference, in an exemplary embodiment of the present disclosure, for convenience of description, an example in which the first score is transformed into a value normalized to at least one of 1, 2 or 3 will be mainly described.

The apparatus may be configured to determine a representative score to be described later through normalization on the first score. For example, the first score may be a score which is determined by a method different from the determination method of the second score and the third score. Therefore, the range of the first score and the range of the second score and the third score may include different ranges. To address this, the apparatus may perform normalization on the first score. Furthermore, the apparatus may be configured to determine a representative score by performing normalization on the first, second, and third scores.

Figure 5:
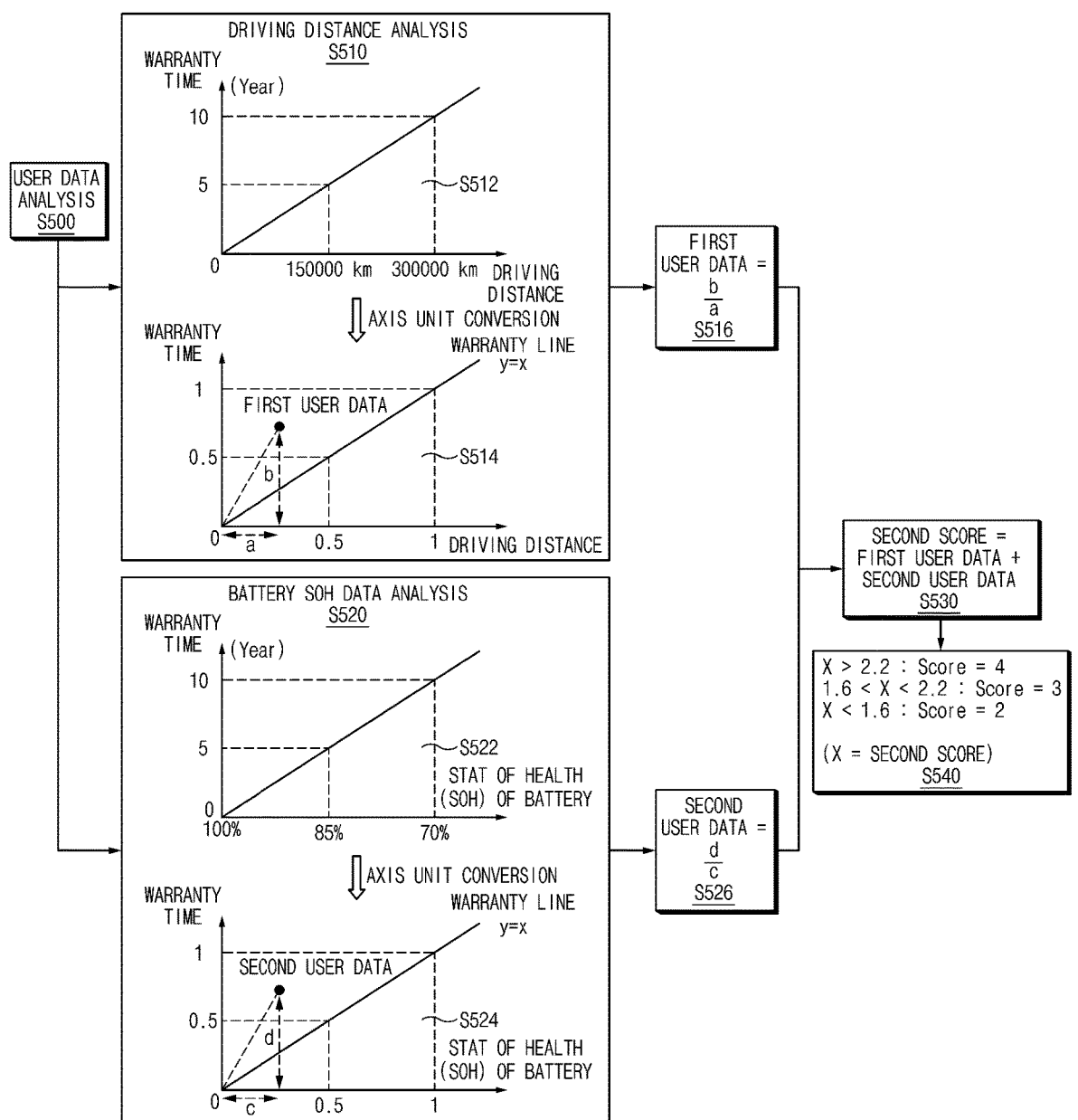
FIG. 5 is a diagram illustrating a method of determining a second score by an apparatus for managing a battery according to an exemplary embodiment of the present disclosure.

FIG. 5 is a diagram illustrating a method of determining a second score by an apparatus for managing a battery according to an exemplary embodiment of the present disclosure.

An apparatus (e.g., the apparatus 100 of FIG. 1) according to various exemplary embodiments of the present disclosure may be configured to determine the second score based on first user data related to the mileage of a vehicle and the warranty time of the vehicle, and the second user data related to the SOH and warranty time of the battery.

In operation S500, the apparatus may analyze user data. For example, the user data may include the mileage according to the warranty time and the SOH of the battery according to the warranty time.

In operation S510, the apparatus may be configured to determine the first user data through mileage analysis. For example, in operation S512, the apparatus may obtain a graph with the mileage of the vehicle as the x-axis and the warranty time as the y-axis.

In operation S514, the apparatus may be configured to generate a graph (hereinafter, referred to as a conversion graph) obtained by converting an axis unit of the obtained graph. For example, the conversion graph may represent a graph in which the mileage and the warranty time are applied at the same ratio.

The device may apply the mileage of the vehicle and the time period (e.g., the warranty time 320 of FIG. 3) from when the vehicle provided with the battery is shipped to the time when the second score is determined in the conversion graph. For reference, in an exemplary embodiment of the present disclosure, for convenience of description, an example, in which a value obtained by applying axis unit conversion to the mileage of the vehicle is 'a', and a value obtained by applying the axis unit conversion to the time period from the time when the vehicle provided with the battery is shipped to time when the second score is determined is 'b', will be mainly described.

In operation S516, the apparatus may obtain first user data indicating a ratio of the mileage of the vehicle and the time period from the time when the vehicle provided with the battery is shipped to the time when the second score is determined.

In operation S520, the apparatus may be configured to determine the second user data through analysis of the SOH of a battery. For example, in operation S522, the apparatus may obtain a graph with the SOH of a battery as the x-axis and the warranty time as the y-axis.

In operation S524, the apparatus may be configured to generate a graph (hereinafter, referred to as a conversion graph) by converting an axis unit of the obtained graph. For example, the conversion graph may represent a graph to which the SOH of a battery and the warranty time are applied at the same ratio.

In the conversion graph, the apparatus may apply the SOH of the battery and the time period (e.g., the warranty time 320 of FIG. 3) from the time when the vehicle provided with the battery is shipped to the time when the second score is determined. For reference, in an exemplary embodiment of the present disclosure, for convenience of explanation, an example, in which a value obtained by applying axis unit conversion to the SOH of the user battery is 'c', and a value obtained by applying the axis unit conversion to the time period from the time when the vehicle provided with the battery is shipped to the time when the second score is determined is 'd', will be mainly described.

In operation S526, the apparatus may obtain the second user data representing the SOH of the battery and a ratio of time from the time when the vehicle provided with the battery is shipped to the time when the second score is determined.

In operation S530, the apparatus may be configured to determine the second score based on the first user data and the second user data. For example, the apparatus may be configured to determine the second score by summing the first user data and the second user data. However, the method for determining the second score is not limited thereto. For example, the apparatus may be configured to determine the second score by applying a weight to each of the first user data and the second user data and summing them. In detail, the apparatus may be configured to determine the second score based on applying a first weight value related to the mileage of the vehicle to the first user data and applying a second weight value related to the SOH of the battery to the second user data. In the instant case, the first weight and the second weight may be different from each other.

For example, the first weight may represent a weight value considering the driving time of the vehicle and the mileage of the vehicle. The apparatus may apply, to the first user data, the first weight representing a driving habit (e.g., a highway driving habit or a city driving habit) which is different for each user based on the driving time of the vehicle and the mileage of the vehicle.

For example, the second weight may represent a weight considering the driving time of the vehicle and the driving environment of the vehicle. The apparatus may apply, to the second user data, the second weight representing a driving environment which is different for each user (e.g., a winter environment where most of the environment is cold) in consideration of the driving time of the vehicle and the driving environment of the vehicle.

In operation S540, the apparatus may perform normalization on the second score. For example, the apparatus may perform normalization on the second score based on whether the second score, which is a real number, is included in a specified range (e.g., a range of less than 1.6). For reference, in an exemplary embodiment of the present disclosure, for convenience of description, an example in which the second score is converted into a normalized value of at least one of 2, 3 or 4 will be mainly described.

The apparatus may be configured to determine a representative score described later through normalization on the second score. For example, the second score may be determined by a method different from those of the first score and the third score. Therefore, the range of the second score may be different from the ranges of the first score and the third score. To address this, the apparatus may perform normalization on the second score. Furthermore, the apparatus may be configured to determine a representative score by performing normalization on the first, second, and third scores.

Figure 6:
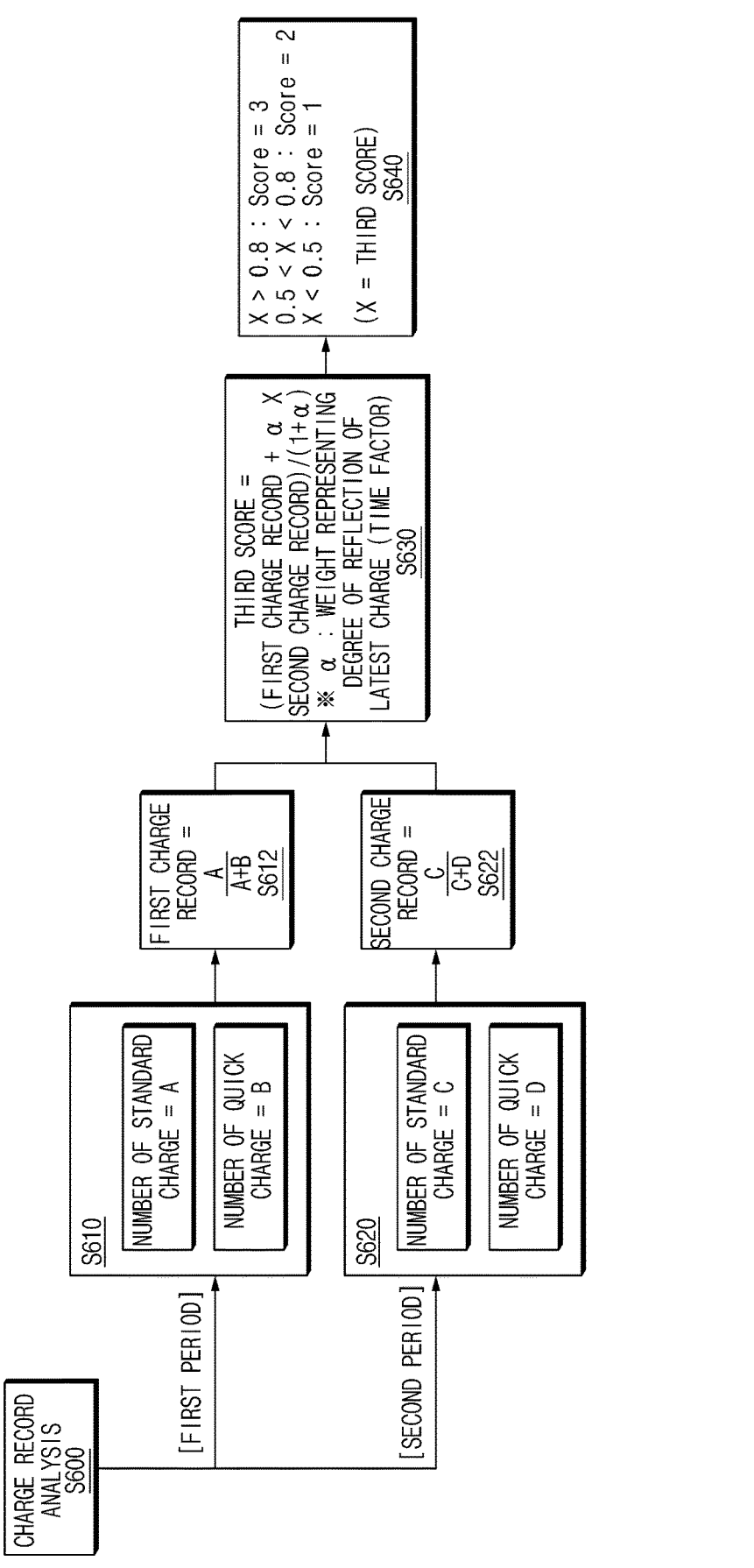
FIG. 6 is a diagram illustrating a method of determining a third score by an apparatus for managing a battery according to an exemplary embodiment of the present disclosure.

FIG. 6 is a diagram illustrating a method of determining a third score by an apparatus for managing a battery according to an exemplary embodiment of the present disclosure.

According to an exemplary embodiment of the present disclosure, an apparatus (e.g., the apparatus 100 of FIG. 1) may be configured to determine the third score based on a first charge record corresponding to a first period of a use time of the battery and a second charge record corresponding to a second period of the use time of the battery.

In operation S600, the apparatus may analyze the charge record of the battery. For example, the apparatus may analyze the standard charge and quick charge of the battery during the first period, and may also analyze the standard charge and quick charge of the battery during the second period. The first period may be a period corresponding to a time from when the vehicle provided with the battery is shipped to when the third score is determined. To the contrary, the second period may be a period prior to a specified period (e.g., one month) based on the time point when the third score is determined.

In operation S610, the apparatus may obtain the number of standard charges of the battery during the first period and the number of quick charges during the first period. In an exemplary embodiment of the present disclosure, for convenience of description, the number of standard charges of the battery during the first period is described as 'A' and the number of quick charges during the first period is described as 'B'.

In operation S612, the apparatus may be configured to determine the first charge record based on the number of standard charges of the battery during the first period and the number of quick charges during the first period. For example, the first charge record may represent a ratio of the number of standard charges of the battery during the first period divided by the number of charges of the battery during the first period. Furthermore, the number of charges of the battery may include the number of standard charges of the battery and the number of quick charges of the battery.

In operation S620, the apparatus may obtain the number of standard charges of the battery during the second period and the number of quick charges during the second period. In an exemplary embodiment of the present disclosure, for convenience of description, the number of standard charges of the battery during the second period is described as 'C', and the number of quick charges during the second period is described as 'D'.

In operation S622, the apparatus may be configured to determine the second charge record based on the number of standard charges of the battery during the second period and the number of quick charges during the second period. For example, the second charge record may indicate a ratio of the number of standard charges of the battery during the second period divided by the number of charges of the battery during the second period.

In operation S630, the apparatus may be configured to determine the third score based on applying specified weights to the first charge record and the second charge record. For example, the apparatus may apply a weight representing a time factor of the latest charging to the second charge record. The apparatus may be configured to determine the third score based on a ratio between the first charge record and the second record to which the aforementioned weight is applied. In more detail, by applying a weight to the second charge record, the apparatus may apply a weight to a previous period as much as a specified period (e.g., one month) based on the time point when the third score is determined. Accordingly, the apparatus may provide the user's battery charging habit during the second period to which a weight is applied compared to the first period as a third score to the user.

However, in an exemplary embodiment of the present disclosure, for convenience of description, an example of applying a specified weight to the second charge record is mainly described, and the specified weight is not limited thereto. For example, the apparatus may apply a third weight for reflection of the second period to the second charge record. The apparatus may be configured to determine the third score based on the first charge record and the second charge record to which the third weight for reflection of the second period is applied.

In operation S640, the apparatus may perform normalization on the third score. For example, the apparatus may perform normalization on the third score based on whether the third score, which is a real number, is included in a specified range (e.g., a range of less than 0.5). For reference, in an exemplary embodiment of the present disclosure, for convenience of description, an example in which the third score is converted into a value normalized to at least one of 1, 2 or 3 will be mainly described.

The apparatus may be configured to determine a representative score to be described later through normalization on the third score. For example, the third score may be determined by a method different from the determination methods of the first score and the second score. Therefore, the range of the third score may be different from the ranges of the first score and the second score. To address this, the apparatus may perform normalization on the third score. Furthermore, the apparatus may be configured to determine a representative score by performing normalization on the first, second, and third scores.

Figure 7:
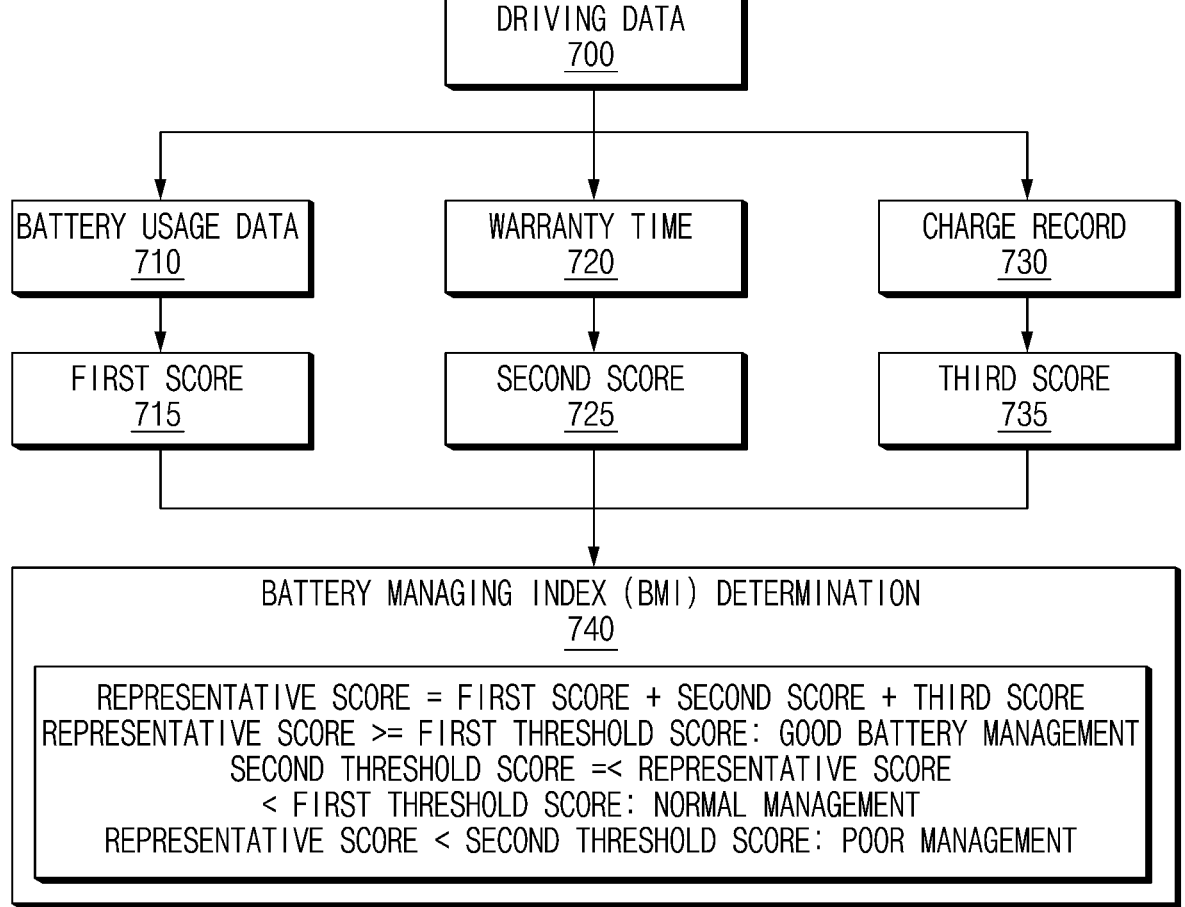
FIG. 7 is a diagram illustrating a method of determining a battery managing index by an apparatus for managing a battery according to an exemplary embodiment of the present disclosure.

FIG. 7 is a diagram illustrating a method of determining a battery managing index by an apparatus for managing a battery according to an exemplary embodiment of the present disclosure.

An apparatus (e.g., the apparatus 100 of FIG. 1) according to various exemplary embodiments of the present disclosure may be configured to determine a battery managing index 740 from driving data 700. The device may obtain battery usage data 710, a warranty time 720, and a charge record 730 from the driving data 700 of a vehicle. The apparatus may be configured to determine a first score 715 based on the obtained battery usage data 710. The apparatus may be configured to determine a second score 725 based on the obtained warranty time 720. The apparatus may be configured to determine a third score 735 based on the obtained charge record 730.

The apparatus may be configured to determine a representative score by summing the first score 715, the second score 725 and the third score 735. The apparatus may be configured to determine as the battery managing index, at least one of a good index, a normal index, and an insufficient index based on the comparison between the representative score and the first threshold score and the comparison between the representative score and the second threshold score.

For example, the device may be configured to determine the good index as the battery managing index when the representative score is equal to or greater than the first threshold score. The apparatus may be configured to determine the normal index as the battery managing index when the representative score is greater than or equal to the second threshold score and the representative score is less than the first threshold score. Finally, when the representative score is less than the second threshold score, the apparatus may be configured to determine the insufficient index as the battery managing index. However, in an exemplary embodiment of the present disclosure, for convenience of description, the method of determining the battery managing index through the first threshold score and the second threshold score is only described as an exemplary embodiment of the present disclosure, and the method of determining the battery managing index is not limited thereto.

Figure 8:
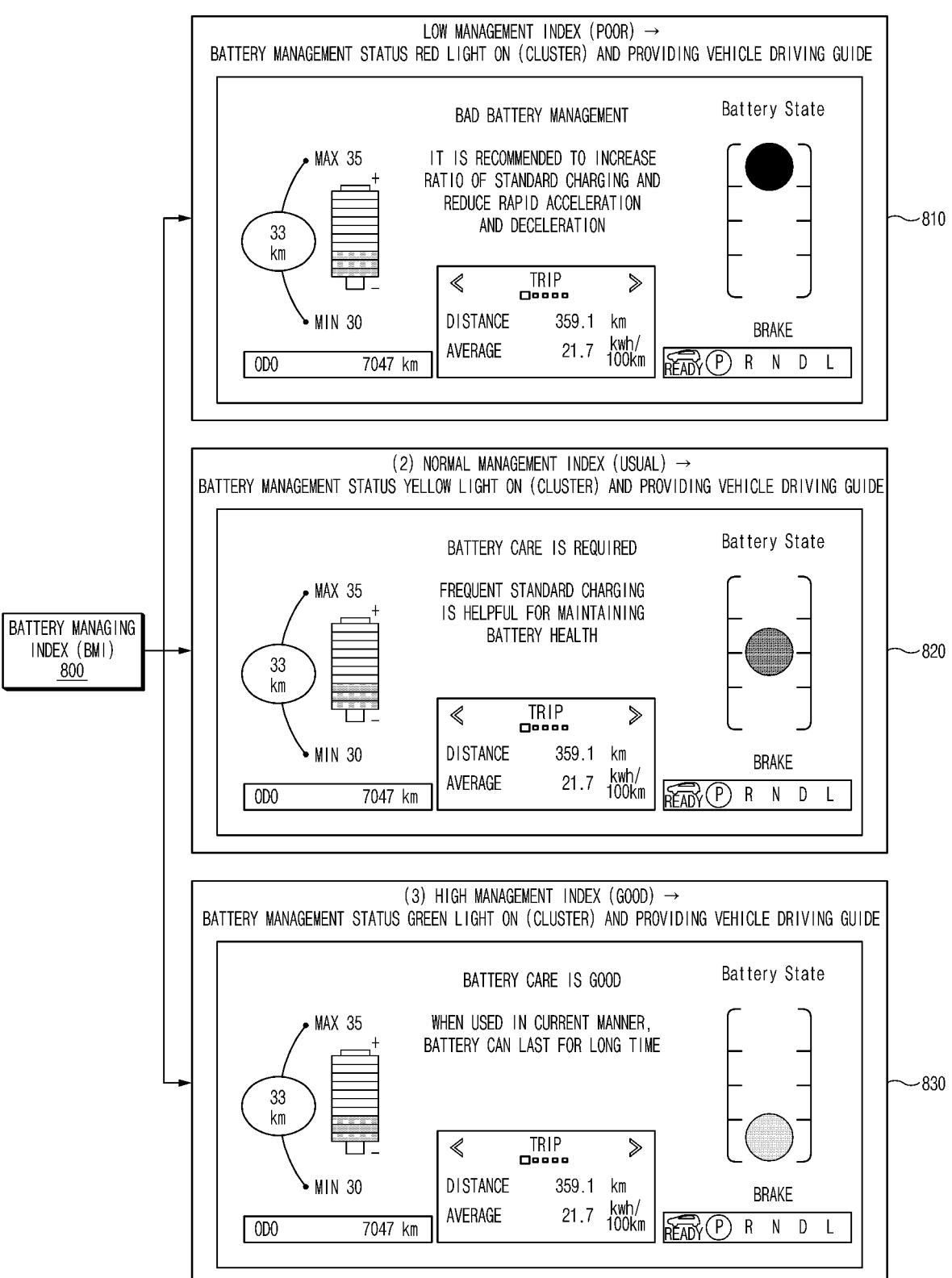
FIG. 8 is a diagram illustrating a method of providing a vehicle driving guide to a user based on a battery managing index according to an exemplary embodiment of the present disclosure.

FIG. 8 is a diagram illustrating a method of providing a vehicle driving guide to a user based on a battery managing index according to an exemplary embodiment of the present disclosure.

An apparatus according to an exemplary embodiment (e.g., the apparatus 100 of FIG. 1) may provide a battery managing index 800 to a user using a vehicle. For example, the apparatus may provide the determined battery managing index 800 to the vehicle user through an output device including vehicle cluster or AVN.

The apparatus may provide a vehicle driving guide according to the battery managing index 800 to the user.

For example, when the battery managing index 800 is an insufficient index, the apparatus may perform a first method 810 of providing a first battery state (e.g., battery management status red light on, battery state, or the like) and a vehicle driving guide related to battery usage to the user.

When the battery managing index 800 is a normal index, the apparatus may perform a second method 820 of providing a second battery state (e.g., battery management state yellow light on, battery state, or the like) and a vehicle driving guide related to battery usage to the user.

When the battery managing index 800 is an insufficient index, the apparatus may perform a third method 830 of providing a second battery state (e.g., battery management state red light on, battery state, or the like) and a vehicle driving guide related to battery usage to the user.

FIG. 9 is a flowchart illustrating a method of managing a battery according to an exemplary embodiment of the present disclosure.

In operation S910, an apparatus (e.g., the apparatus 100 of FIG. 1) may be configured to determine a first score based on battery usage data and a battery output map. As described above, the first score may be determined based on charge output data and discharge output data.

In operation S920, the apparatus may be configured to determine a second score based on first user data related to the mileage of a vehicle and the warranty time of the vehicle, and second user data related to the SOH and warranty time of the battery.

In operation S930, the apparatus may be configured to determine a third score based on a first charge record corresponding to a first period of a use time of the battery and a second charge record corresponding to a second period of the use time of the battery.

In operation S940, the apparatus may derive a battery managing index (BMI) indicating the management state of the battery based on the first score, the second score and the third score.

Figure 10:
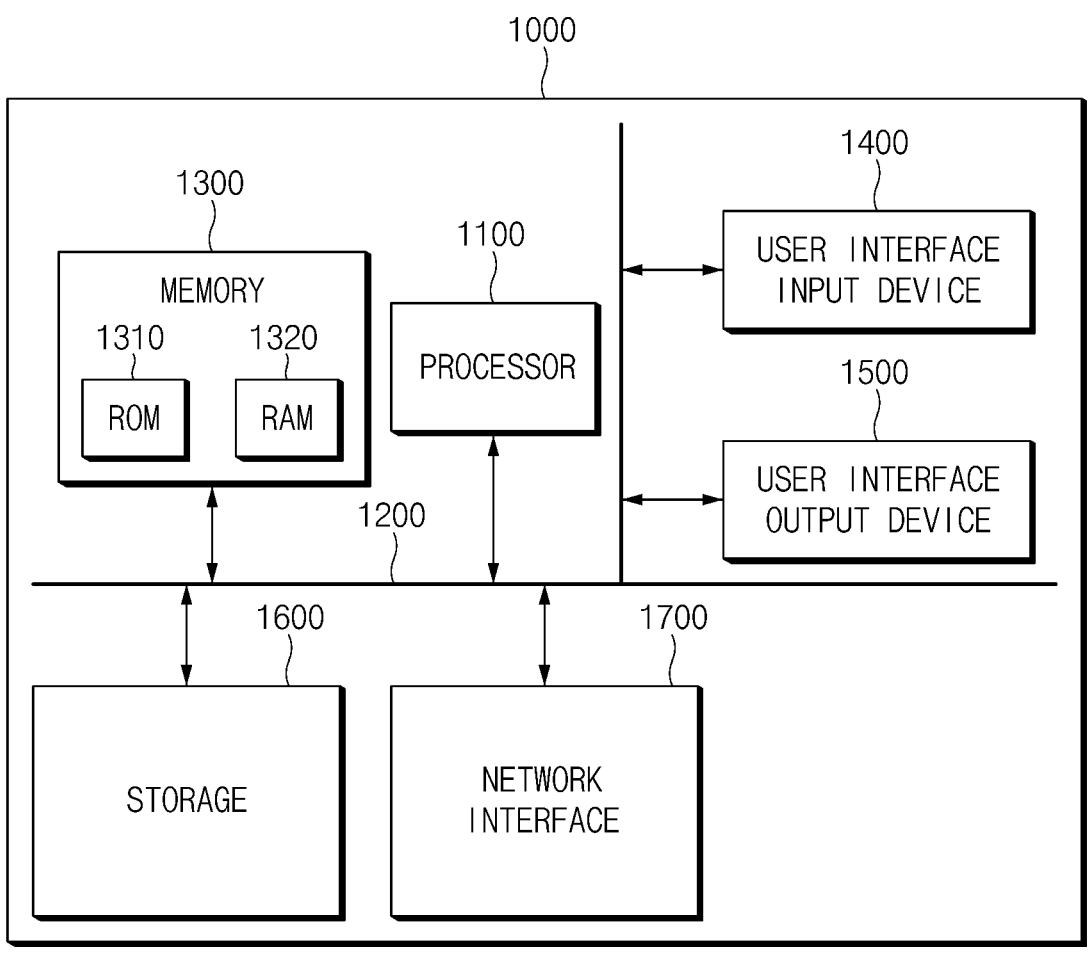
FIG. 10 is a block diagram illustrating a computing system for executing a method of managing a battery according to an exemplary embodiment of the present disclosure.

FIG. 10 is a block diagram illustrating a computing system for executing a method of managing a battery according to an exemplary embodiment of the present disclosure.

Referring to FIG. 10, a computing system 1000 may include at least one processor 1100, a memory 1300, a user interface input device 1400, a user interface output device 1500, storage 1600, and a network interface 1700 connected through a bus 1200.

The processor 1100 may be a central processing unit (CPU) or a semiconductor device that processes instructions stored in the memory 1300 and/or the storage 1600. The memory 1300 and the storage 1600 may include various volatile or nonvolatile storage media. For example, the memory 1300 may include a read only memory (ROM) and a random access memory (RAM).

Accordingly, the processes of the method or algorithm described in relation to the exemplary embodiments of the present disclosure may be implemented directly by hardware executed by the processor 1100, a software module, or a combination thereof. The software module may reside in a storage medium (that is, the memory 1300 and/or the storage 1600), such as a RAM memory, a flash memory, a ROM memory, an EPROM memory, an EEPROM memory, a register, a hard disk, solid state drive (SSD), a detachable disk, or a CD-ROM.

The exemplary storage medium is coupled to the processor 1100, and the processor 1100 may read information from the storage medium and may write information in the storage medium. In another method, the storage medium may be integrated with the processor. The processor 1100 and the storage medium may reside in an application specific integrated circuit (ASIC). The ASIC may reside in a user terminal. In another method, the processor and the storage medium may reside in the user terminal as an individual component.

Although embodiments of the present disclosure have been described for illustrative purposes, those skilled in the art will appreciate that various modifications, additions and substitutions are possible, without departing from the scope and spirit of the present disclosure.

The exemplary embodiments described above may be realized by hardware elements, software elements and/or combinations thereof. For example, the devices and components illustrated in the exemplary embodiments of the present disclosure may be implemented in one or more general-use computers or special-purpose computers, such as a processor, a controller, an arithmetic logic unit (ALU), a digital signal processor, a microcomputer, a field programmable gate array (FPGA), a programmable logic unit (PLU), a microprocessor or any device which may execute instructions and respond. A processing unit may implement an operating system (OS) or software applications running on the OS. Furthermore, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may include a different processing configuration, such as a parallel processor.

Software may include computer programs, codes, instructions or one or more combinations thereof and may configure a processing unit to operate in a desired manner or may independently or collectively control the processing unit. Software and/or data may be permanently or temporarily embodied in any type of machine, components, physical equipment, virtual equipment, computer storage media or units or transmitted signal waves to be interpreted by the processing unit or to provide instructions or data to the processing unit. Software may be dispersed throughout computer systems connected via networks and may be stored or executed in a dispersion manner. Software and data may be recorded in one or more computer-readable storage media.

The methods according to the above-described exemplary embodiments of the inventive concept may be implemented with program instructions which may be executed through various computer means and may be recorded in computer-readable media. The media may also include, alone or in combination with the program instructions, data files, data structures, and the like. The program instructions recorded in the media may be designed and configured specially for the exemplary embodiments of the inventive concept or be known and available to those skilled in computer software. Computer-readable media include magnetic media such as hard disks, floppy disks, and magnetic tape; optical media such as compact disc-read only memory (CD-ROM) disks and digital versatile discs (DVDs); magneto-optical media such as floptical disks; and hardware devices that are specially configured to store and perform program instructions, such as read-only memory (ROM), random access memory (RAM), flash memory, and the like. Program instructions include both machine codes, such as produced by a compiler, and higher level codes which may be executed by the computer using an interpreter.

The described hardware devices may be configured to act as one or more software modules to perform the operations of the above-described exemplary embodiments of the inventive concept, or vice versa.

According to an exemplary embodiment of the present disclosure, it is possible to determine a battery managing index (BMI) indicating a management state of a battery based on a first score related to a battery output map, a second score related to a vehicle mileage, and a third score related to a battery charge record, providing a vehicle driving guide to a user.

Furthermore, it is possible to determine charge output data and discharge output data based on battery usage data and a battery output map, providing a user with a numerical value of battery performance.

Furthermore, it is possible to determine an average value of charge output and a maximum value of charge output based on measurement conditions for the temperature and state of charge of the battery, providing a user with SOH of the battery.

Furthermore, it is possible to determine data on a battery charge record based on the number of standard charges and the number of quick charges of the battery for each use period of the battery, providing a user with information related to charging habits.

Furthermore, various effects that are directly or indirectly understood through the present disclosure may be provided.

While a few exemplary embodiments have been shown and described with reference to the accompanying drawings, it will be apparent to those skilled in the art that various modifications and variations may be made from the foregoing descriptions. For example, adequate effects may be achieved even if the foregoing processes and methods are conducted in different order than described above, and/or the aforementioned elements, such as systems, structures, devices, or circuits, are combined or coupled in different forms and modes than as described above or be substituted or switched with other components or equivalents.

Thus, it is intended that the present disclosure covers other realizations and other embodiments of the present disclosure provided they come within the scope of the appended claims and their equivalents.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of one or more of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An apparatus for managing a battery, the apparatus comprising:
a memory configured to store computer-executable instructions; and
at least one processor configured to access the memory and execute the instructions,
wherein the at least one processor is configured to:
determine a first score based on battery usage data and a battery output map;
determine a second score based on first user data on a mileage of a vehicle using the battery and a warranty time of the vehicle, and second user data on a state of health (SOH) of the battery and the warranty time;
determine a battery managing index (BMI) representing a management state of the battery based on the first score and the second score;
determine a third score based on a first charge record corresponding to a first period of a use time of the battery and a second charge record corresponding to a second period of the use time of the battery; and
determine the BMI based on the first score, the second score and the third score.

2. The apparatus of claim 1, wherein the at least one processor is further configured to:
determine charge output data based on charging data of the battery usage data and maximum charging data of the battery output map;
determine discharge output data based on discharge data of the battery usage data and maximum discharge data of the battery output map; and determine the first score based on the charge output data and the discharge output data.

3. The apparatus of claim 2, wherein the at least one processor is further configured to:
determine an average charge output of the charging data based on a temperature of the battery and a measurement condition related to a state of charge (SOC) value of the battery;
determine a maximum charge output of the maximum charging data based on the measurement condition; and
determine the charge output data based on a ratio of the average charge output and the maximum charge output.

4. The apparatus of claim 2, wherein the at least one processor is further configured to:
determine an average discharge output of the discharge data based on a temperature of the battery and a measurement condition related to a state of charge (SOC) value of the battery;
determine a maximum discharge output of the maximum discharge data based on the measurement condition; and
determine the discharge output data based on a ratio of the average discharge output and the maximum discharge output.

5. The apparatus of claim 1, wherein the at least one processor is further configured to:
determine the second score based on applying a first weight value related to the mileage of the vehicle to the first user data and applying a second weight value related to the SOH of the battery to the second user data.

6. The apparatus of claim 1, wherein the at least one processor is further configured to:
determine the first charge record based on a ratio of a number of standard charges of the battery during the first period and a number of charges of the battery during the first period;
determine the second charge record based on a ratio of a number of standard charges of the battery during the second period and a number of charges of the battery during the second period; and
determine the third score based on the first charge record and the second charge record,
wherein the number of charges of the battery in the first period and the second period includes the number of standard charges of the battery and a number of quick charges of the battery in the first period and the second period.

7. The apparatus of claim 6, wherein the at least one processor is further configured to:
determine the third score based on the first charge record and the second charge record to which a third weight for reflection of the second period is applied.

8. The apparatus of claim 1, wherein the at least one processor is further configured to:
determine a representative score by summing the first score, the second score and the third score; and
compare the representative score with a first threshold score and determine the battery managing index as at least one of a good index, a normal index, and an insufficient index based on comparison between the representative score and a second threshold score.

9. The apparatus of claim 1, wherein the at least one processor is further configured to:
provide the battery managing index to a user using the vehicle via an output device operatively connected to the at least one processor; and provide a battery usage guide or a vehicle driving guide according to the battery managing index to the user.

10. A method of managing a battery, the method comprising:

determining, by at least one processor, a first score based on battery usage data and a battery output map;

determining, by the at least one processor, a second score based on first user data on a mileage of a vehicle using the battery and a warranty time of the vehicle, and second user data on a state of health (SOH) of the battery and the warranty time;

deriving, by the at least one processor, a battery managing index (BMI) representing a management state of the battery based on the first score and the second score;

determining, by the at least one processor, a third score based on a first charge record corresponding to a first period of a use time of the battery and a second charge record corresponding to a second period of the use time of the battery; and deriving, by the at least one processor, the BMI based on the first score, the second score and the third score.

11. The method of claim 10, wherein the determining of the first score includes:

determining charge output data based on charging data of the battery usage data and maximum charging data of the battery output map;

determining discharge output data based on discharge data of the battery usage data and maximum discharge data of the battery output map; and determining the first score based on the charge output data and the discharge output data.

12. The method of claim 11, wherein the determining of the charge output data includes:

determining an average charge output of the charging data based on a temperature of the battery and a measurement condition related to a state of charge (SOC) value of the battery;

determining a maximum charge output of the maximum charging data based on the measurement condition; and determining the charge output data based on a ratio of the average charge output and the maximum charge output.

13. The method of claim 11, wherein the determining of the discharge data includes:

determining an average discharge output of the discharge data based on a temperature of the battery and a measurement condition related to a state of charge (SOC) value of the battery;

determining a maximum discharge output of the maximum discharge data based on the measurement condition; and determining the discharge output data based on a ratio of the average discharge output and the maximum discharge output.

14. The method of claim 10, wherein the determining of the second score includes:

determining the second score based on applying a first weight value related to the mileage of the vehicle to the first user data and applying a second weight value related to the SOH of the battery to the second user data.

15. The method of claim 10, wherein the determining of the third score includes:

determining the first charge record based on a ratio of a number of standard charges of the battery during the first period and a number of charges of the battery during the first period;

determining the second charge record based on a ratio of a number of standard charges of the battery during the second period and a number of charges of the battery during the second period; and determining the third score based on the first charge record and the second charge record, wherein the number of charges of the battery in the first period and the second period includes the number of standard charges of the battery and a number of quick charges of the battery in the first period and the second period.

16. The method of claim 15, wherein the determining of the third score includes:

determining the third score based on the first charge record and the second charge record to which a third weight for reflection of the second period is applied.

17. The method of claim 10, wherein the deriving of the battery managing index includes:

determining a representative score by summing the first score, the second score and the third score; and comparing the representative score with a first threshold score and determining the battery managing index as at least one of a good index, a normal index, and an insufficient index based on the comparison between the representative score and a second threshold score.

18. The method of claim 10, further including:

providing the battery managing index to a user using the vehicle via an output device operatively connected to the at least one processor; and providing a battery usage guide or a vehicle driving guide according to the battery managing index to the user.

* * * * *